US011748871B2

(12) United States Patent
Jiang et al.

(10) Patent No.: US 11,748,871 B2
(45) Date of Patent: Sep. 5, 2023

(54) ALIGNMENT OF A SPECIMEN FOR INSPECTION AND OTHER PROCESSES

(71) Applicant: KLA Corporation, Milpitas, CA (US)

(72) Inventors: Xuguang Jiang, San Jose, CA (US); Tong Huang, Saratoga, CA (US); N R Girish, San Jose, CA (US); Yiyu Zhang, Santa Clara, CA (US); Faisal Omer, San Jose, CA (US); Wei Kang, Fremont, CA (US); Ashok Varadarajan, Fremont, CA (US); Vadim Romanovski, San Ramon, CA (US)

(73) Assignee: KLA Corp., Milpitas, CA (US)

( * ) Notice: Subject to any disclaimer, the term of this patent is extended or adjusted under 35 U.S.C. 154(b) by 137 days.

(21) Appl. No.: 17/157,992

(22) Filed: Jan. 25, 2021

(65) Prior Publication Data

US 2022/0101506 A1 Mar. 31, 2022

Related U.S. Application Data

(60) Provisional application No. 63/084,024, filed on Sep. 28, 2020.

(51) Int. Cl.
*G06T 7/00* (2017.01)
*G06T 7/73* (2017.01)
(Continued)

(52) U.S. Cl.
CPC ......... *G06T 7/001* (2013.01); *G01N 21/9501* (2013.01); *G06T 7/337* (2017.01);
(Continued)

(58) Field of Classification Search
USPC ...... 382/149, 151, 144, 289; 356/138; 438/7
See application file for complete search history.

(56) References Cited

U.S. PATENT DOCUMENTS 4,153,371 A * 5/1979 Koizumi ................... G03F 9/70
356/400
4,457,664 A * 7/1984 Judell ..................... H01L 21/68
414/757
(Continued)

FOREIGN PATENT DOCUMENTS

CN 104536273 4/2015
CN 107085842 8/2017
(Continued)

OTHER PUBLICATIONS

International Search Report for PCT/US2021/049543 dated Jan. 3, 2022.
(Continued)

*Primary Examiner* — Kathleen Y Dulaney
(74) *Attorney, Agent, or Firm* — Ann Marie Mewherter

(57) ABSTRACT

Methods and systems for setting up alignment of a specimen are provided. One system includes computer subsystem(s) configured for acquiring two-dimensional (2D) images generated from output of a detector of an output acquisition subsystem at template locations in corresponding areas of printed instances on a specimen. The computer subsystem(s) determine offsets in x and y directions between the template locations using the 2D images and determine an angle of the specimen with respect to the output acquisition subsystem based on the offsets. If the angle is greater than a predetermined value, the computer subsystem(s) rotate the specimen and repeat the steps described above. If the angle is less than the predetermined value, the computer subsystem(s) store one of the 2D images for alignment of the specimen in a process performed on a specimen. The 2D images may include multi-mode images, which may be fused prior to determining the offsets.

19 Claims, 7 Drawing Sheets

(51) Int. Cl.
*G06T 7/33* (2017.01)
*H01L 21/67* (2006.01)
*G01N 21/95* (2006.01)

(52) U.S. Cl.
CPC .......... *G06T 7/74* (2017.01); *H01L 21/67288* (2013.01); *G06T 2207/20221* (2013.01); *G06T 2207/30148* (2013.01)

(56) References Cited

U.S. PATENT DOCUMENTS

| | | | |
|---|---|---|---|
| 4,780,617 A * | 10/1988 | Umatate | G03F 9/7003 250/548 |
| 5,298,939 A * | 3/1994 | Swanson | G03F 7/70275 355/71 |
| 5,324,381 A * | 6/1994 | Nishiguchi | H05K 13/0812 382/151 |
| 6,498,640 B1 * | 12/2002 | Ziger | G03F 9/7049 355/53 |
| 6,541,283 B1 * | 4/2003 | Leroux | G03F 7/70975 430/311 |
| 7,271,908 B2 | 9/2007 | Noguchi et al. | |
| 7,570,796 B2 * | 8/2009 | Zafar | G03F 1/84 382/145 |
| 7,676,077 B2 * | 3/2010 | Kulkarni | H01L 21/67005 382/145 |
| 8,126,255 B2 | 2/2012 | Bhaskar et al. | |
| 8,139,230 B2 * | 3/2012 | Roberge | F42B 35/00 356/138 |
| 8,223,327 B2 | 7/2012 | Chen et al. | |
| 8,538,168 B2 | 9/2013 | Liu | |
| 8,644,591 B2 * | 2/2014 | Lin | G06T 7/33 382/152 |
| 8,664,594 B1 | 3/2014 | Jiang et al. | |
| 8,692,204 B2 | 4/2014 | Kojima et al. | |
| 8,698,093 B1 | 4/2014 | Gubbens et al. | |
| 8,716,662 B1 | 5/2014 | MacDonald et al. | |
| 9,092,846 B2 | 7/2015 | Wu et al. | |
| 9,222,895 B2 | 12/2015 | Duffy et al. | |
| 9,891,175 B2 | 2/2018 | Sullivan et al. | |
| 10,048,477 B1 * | 8/2018 | Putman | G02B 21/26 |
| 10,416,088 B2 | 9/2019 | Duffy et al. | |
| 10,605,744 B2 | 3/2020 | Chen et al. | |
| 2001/0042845 A1 * | 11/2001 | van der Muehlen | H01L 21/681 250/559.29 |
| 2004/0013318 A1 * | 1/2004 | Simske | H04N 1/3878 382/289 |
| 2006/0164657 A1 * | 7/2006 | Chalmers | G01B 11/0641 356/630 |
| 2007/0156379 A1 | 7/2007 | Kulkarni et al. | |
| 2012/0243773 A1 * | 9/2012 | Kulkarni | G01N 21/9501 382/149 |
| 2015/0228522 A1 * | 8/2015 | Lin | H01L 21/67144 348/126 |
| 2016/0293379 A1 * | 10/2016 | Kim | H01J 37/28 |
| 2019/0122913 A1 * | 4/2019 | Lauber | G06T 7/001 |
| 2019/0139208 A1 * | 5/2019 | Chen | G06T 7/30 |
| 2019/0339505 A1 * | 11/2019 | Siebenmorgen | G02B 21/0032 |

FOREIGN PATENT DOCUMENTS

| | | |
|---|---|---|
| KR | 10-1602580 | 3/2016 |
| KR | 10-2017-0137339 | 12/2017 |
| WO | 2018/176926 | 10/2018 |

OTHER PUBLICATIONS

Mishne et al., "Multi-channel wafer defect detection using diffusion maps," 2014 IEEE 28th Convention of Electrical & Electronics Engineers in Israel (IEEEI), Dec. 2014, 5 pages.

* cited by examiner

ALIGNMENT OF A SPECIMEN FOR INSPECTION AND OTHER PROCESSES

BACKGROUND OF THE INVENTION

1. Field of the Invention

The present invention generally relates to methods and systems for setting up alignment of a specimen. Certain embodiments relate to setting up alignment of a specimen to an output acquisition subsystem for a process such as inspection.

2. Description of the Related Art

The following description and examples are not admitted to be prior art by virtue of their inclusion in this section.

Inspection processes are used at various steps during a semiconductor manufacturing process to detect defects on reticles and wafers to promote higher yield in the manufacturing process and thus higher profits. Inspection has always been an important part of fabricating semiconductor devices. However, as the dimensions of semiconductor devices decrease, inspection becomes even more important to the successful manufacture of acceptable semiconductor devices because smaller defects can cause the devices to fail.

The success of an inspection process depends, at least in part, on the positional arrangement of the specimen within the inspection tool or system. For example, prior to scanning light or other energy over the specimen for inspection, the specimen is placed within the inspection tool and aligned to the inspection tool in some predetermined manner. The alignment may be performed with respect to any of the hardware of the inspection tool such as the imaging hardware or the stage or other surface on which the specimen is disposed. Such alignment is performed for a number of reasons such as to ensure that the specimen is scanned in a predetermined manner thereby enabling inspection of the areas of interest on the specimen as determined in inspection process setup. Orientation of the specimen with respect to the imaging hardware can also affect whether patterned features are visible or invisible in images generated of the specimen. For example, one inspection tool channel may be able to image only horizontally oriented patterned features when the specimen is in one orientation, and another inspection tool channel may be able to image only vertically oriented patterned features when the specimen is in that orientation. Therefore, for a number of reasons, it is important that the specimen be arranged positionally with respect to the inspection tool in a predetermined manner with substantially high accuracy.

There are a variety of currently used methods and systems for aligning a specimen with respect to an inspection tool. One such method includes one-dimensional (1D) projection-based alignment. This method uses a single channel image (i.e., an image generated using only one channel of the inspection tool). The method includes converting the two-dimensional (2D) image into 1D X and Y projections. The method then uses the projections to calculate specimen alignment. Another such method includes 2D optical image alignment. This method uses the optical image from a review camera integrated into the inspection tool, but not used for inspection purposes, to perform specimen alignment.

The currently used methods and systems for aligning a specimen to an inspection tool have a number of significant disadvantages. For example, the 1D projection alignment method suffers from false alignment issues because different specimen patterns can have the same 1D projection. This method also uses only one channel image in alignment. On some tools, a single channel may image only horizontal or vertical patterns, which makes it difficult to calculate alignment on both the X and Y directions. The 2D optical image alignment method also has a number of disadvantages including low alignment angle measurement accuracy, which may be caused at least in part by an optical image pixel resolution that is lower than the detector image pixels as well as relatively low (8-bit) grey level images. The 2D optical image alignment method also has a relatively slow speed. For example, this method includes moving to the same spot in every die, acquiring focus metrics, and then grabbing images.

Specimen-to-specimen (and/or scan-to-scan) variations in the relative positional relationship between specimen and inspection tool can also be problematic when alignment is not accurate and reproducible. For example, if there is variation in the position of different specimens with respect to an inspection tool, even if the results for the different specimens are not greatly affected by the variation, the variation can introduce errors in determining or tracking such process quality control measures as specimen-to-specimen variation and process-to-process variation using the inspection results. In one such example, even relatively small variations in the positions of specimens with respect to an inspection tool can cause certain defects to be undetected or misidentified (e.g., as belonging to a particular care area or region), which can cause errors and uncertainties in the inspection results from specimen-to-specimen, scan-to-scan, or process-to-process. Such errors and uncertainties in the inspection results can significantly degrade the usefulness of the inspection results and can even cause any corrections made in response to the inspection results to be detrimental to the performance of the processes.

Accordingly, it would be advantageous to develop systems and methods for setting up alignment of a specimen to an output acquisition subsystem that do not have one or more of the disadvantages described above.

SUMMARY OF THE INVENTION

The following description of various embodiments is not to be construed in any way as limiting the subject matter of the appended claims.

One embodiment relates to a system configured for setting up alignment of a specimen. The system includes an output acquisition subsystem that includes at least an energy source and a detector. The energy source is configured to generate energy that is directed to a specimen, and the detector is configured to detect energy from the specimen and to generate output responsive to the detected energy.

The system also includes one or more computer subsystems configured for acquiring two-dimensional (2D) images generated from the output of the detector at template locations in corresponding areas of printed instances on the specimen. The 2D images include a first image acquired at a first of the template locations and at least one additional image acquired at one or more other of the template locations. The computer subsystem(s) are also configured for determining offsets in x and y directions between the template locations. Determining the offsets includes aligning the first image to the at least one additional image. The computer subsystem(s) are further configured for determining an angle of the specimen with respect to the output acquisition subsystem based on the offsets in the x and y directions and comparing the determined angle to a predetermined value. When the determined angle is greater than the predetermined value, the computer subsystem(s) are configured for rotating the specimen and repeating the acquiring, determining the offsets, determining the angle, and comparing steps. When the determined angle is less than the predetermined value, the one or more computer subsystems are configured for storing the first image for use in alignment of the specimen to the output acquisition subsystem during a process performed on the specimen. The system may be further configured as described herein.

Another embodiment relates to a computer-implemented method for setting up alignment of a specimen. The method includes the acquiring, determining offsets, determining an angle, comparing, rotating, repeating, and storing steps described above. The steps of the method are performed by one or more computer subsystems.

Each of the steps of the method may be further performed as described further herein. In addition, the method may include any other step(s) of any other method(s) described herein. Furthermore, the method may be performed by any of the systems described herein.

Another embodiment relates to a non-transitory computer-readable medium storing program instructions executable on a computer system for performing a computer-implemented method for setting up alignment of a specimen. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
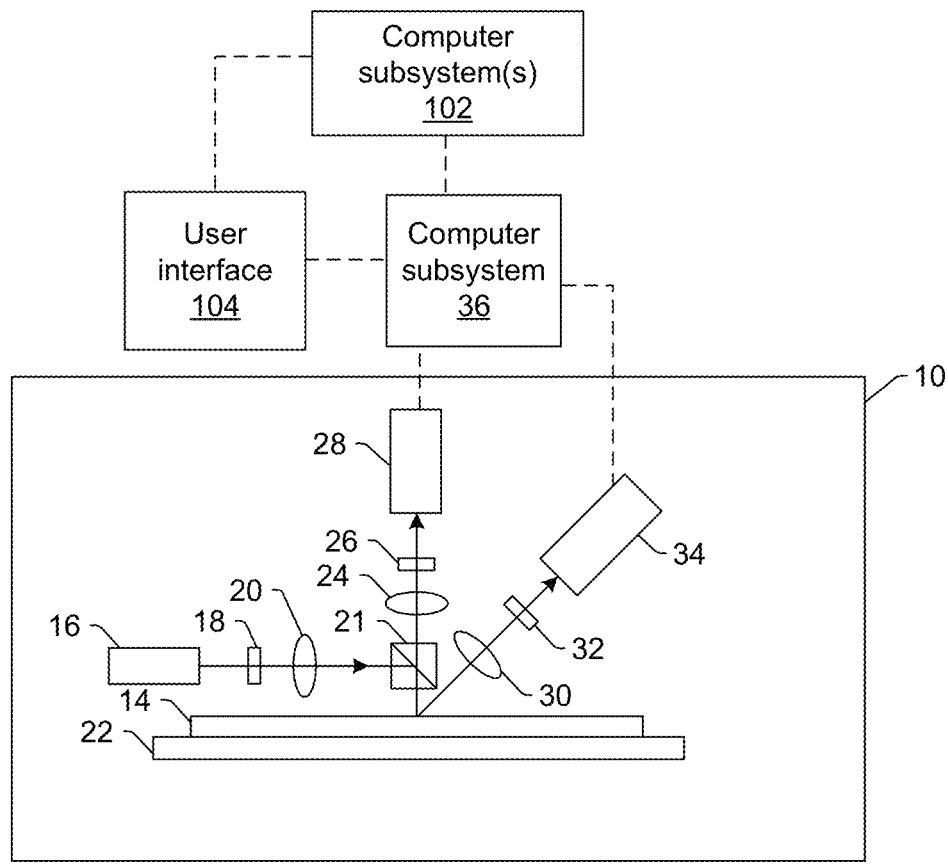
FIGS. 1 and 2 are schematic diagrams illustrating side views of embodiments of a system configured as described herein.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "design" and "design data" as used herein generally refer to the physical design (layout) of an IC and data derived from the physical design through complex simulation or simple geometric and Boolean operations. The physical design may be stored in a data structure such as a graphical data stream (GDS) file, any other standard machine-readable file, any other suitable file known in the art, and a design database. A GDSII file is one of a class of files used for the representation of design layout data. Other examples of such files include GL1 and OASIS files and proprietary file formats such as RDF data, which is proprietary to KLA Corp., Milpitas, Calif. In addition, the "design" and "design data" described herein refers to information and data that is generated by semiconductor device designers in a design process and is therefore available for use in the embodiments described herein well in advance of printing of the design on any physical wafers. The design may include any other design data or design data proxies described in commonly owned U.S. Pat. No. 7,570,796 issued on Augu. 4, 2009 to Zafar et al. and 7,676,077 issued on Mar. 9, 2010 to Kulkarni et al., both of which are incorporated by reference as if fully set forth herein.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

One embodiment relates to a system configured for setting up alignment of a specimen. Some embodiments described herein relate to a system for wafer alignment using multi-channel two-dimensional (2D) photo-multiplier tube (PMT) images.

In one embodiment, the specimen is a wafer. The wafer may include any wafer known in the semiconductor arts. In another embodiment, the specimen is a reticle. The reticle may include any reticle known in the semiconductor arts. Although some embodiments may be described herein with respect to a wafer or wafers, the embodiments are not limited in the specimen for which they can be used. For example, the embodiments described herein may be used for specimens such as reticles, flat panels, personal computer (PC) boards, and other semiconductor specimens.

One embodiment of such a system is shown in FIG. 1. The system includes an output acquisition subsystem that includes at least an energy source and a detector. The energy source is configured to generate energy that is directed to a specimen. The detector is configured to detect energy from the specimen and to generate output responsive to the detected energy.

In one embodiment, the energy directed to the specimen includes light, and the energy detected from the specimen includes light. For example, in the embodiment of the system shown in FIG. 1, output acquisition subsystem 10 includes an illumination subsystem configured to direct light to specimen 14. The illumination subsystem includes at least one light source. For example, as shown in FIG. 1, the illumination subsystem includes light source 16. In one embodiment, the illumination subsystem is configured to direct the light to the specimen at one or more angles of incidence, which may include one or more oblique angles and/or one or more normal angles. For example, as shown in FIG. 1, light from light source 16 is directed through optical element 18 and then lens 20 to beam splitter 21, which directs the light to specimen 14 at a normal angle of incidence. The angle of incidence may include any suitable angle of incidence, which may vary depending on, for instance, characteristics of the specimen, the defects to be detected on the specimen, the measurements to be performed on the specimen, etc.

The illumination subsystem may be configured to direct the light to the specimen at different angles of incidence at different times. For example, the output acquisition subsystem may be configured to alter one or more characteristics of one or more elements of the illumination subsystem such that the light can be directed to the specimen at an angle of incidence that is different than that shown in FIG. 1. In one such example, the output acquisition subsystem may be configured to move light source 16, optical element 18, and lens 20 such that the light is directed to the specimen at a different angle of incidence.

In some instances, the output acquisition subsystem may be configured to direct light to the specimen at more than one angle of incidence at the same time. For example, the output acquisition subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example, in some instances, optical element 18 may be configured as a spectral filter and the properties of the spectral filter can be changed in a variety of different ways (e.g., by swapping out the spectral filter) such that different wavelengths of light can be directed to the specimen at different times. The illumination subsystem may have any other suitable configuration known in the art for directing light having different or the same characteristics to the specimen at different or the same angles of incidence sequentially or simultaneously.

In one embodiment, light source 16 may include a broadband plasma (BBP) light source. In this manner, the light generated by the light source and directed to the specimen may include broadband light. However, the light source may include any other suitable light source such as a laser, which may be any suitable laser known in the art and may be configured to generate light at any suitable wavelength(s) known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused to beam splitter 21 by lens 20. Although lens 20 is shown in FIG. 1 as a single refractive optical element, in practice, lens 20 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more elements of the illumination subsystem based on the type of illumination to be used for inspection, metrology, etc.

The output acquisition subsystem may also include a scanning subsystem configured to cause the light to be scanned over the specimen. For example, the output acquisition subsystem may include stage 22 on which specimen 14 is disposed during inspection, measurement, etc. The scanning subsystem may include any suitable mechanical and/or robotic assembly (that includes stage 22) that can be configured to move the specimen such that the light can be scanned over the specimen. In addition, or alternatively, the output acquisition subsystem may be configured such that one or more optical elements of the output acquisition subsystem perform some scanning of the light over the specimen. The light may be scanned over the specimen in any suitable fashion.

The output acquisition subsystem further includes one or more detection channels. At least one of the one or more detection channels includes a detector configured to detect light from the specimen due to illumination of the specimen by the output acquisition subsystem and to generate output responsive to the detected light. For example, the output acquisition subsystem shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, one detection channel is configured to detect specularly reflected light, and the other detection channel is configured to detect light that is not specularly reflected (e.g., scattered, diffracted, etc.) from the specimen. However, two or more of the detection channels may be configured to detect the same type of light from the specimen (e.g., specularly reflected light). Although FIG. 1 shows an embodiment of the output acquisition subsystem that includes two detection channels, the output acquisition subsystem may include a different number of detection channels (e.g., only one detection channel or two or more detection channels). Although each of the collectors are shown in FIG. 1 as single refractive optical elements, each of the collectors may include one or more refractive optical element(s) and/or one or more reflective optical element(s).

The one or more detection channels may include any suitable detectors known in the art. For example, the detectors may include photo-multiplier tubes (PMTs) or any other suitable non-imaging detectors known in the art. If the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels may be signals or data, but not image signals or image data. In such instances, a computer subsystem such as computer subsystem 36 of the system may be configured to generate images of the specimen from the non-imaging output of the detectors.

It is noted that FIG. 1 is provided herein to generally illustrate a configuration of an output acquisition subsystem that may be included in the system embodiments described herein. Obviously, the output acquisition subsystem configuration described herein may be altered to optimize the performance of the system as is normally performed when designing a commercial inspection, metrology, etc. system. In addition, the systems described herein may be implemented using an existing inspection or metrology system (e.g., by adding functionality described herein to an existing inspection or metrology system) such as the 29xx and 39xx series of tools, the SpectraShape family of tools, and the Archer series of tools that are commercially available from KLA. For some such systems, the embodiments described herein may be provided as optional functionality of the inspection or metrology system (e.g., in addition to other functionality of the inspection or metrology system). Alternatively, the output acquisition subsystem described herein may be designed "from scratch" to provide a completely new inspection or metrology system.

Computer subsystem 36 of the system may be coupled to the detectors of the output acquisition subsystem in any suitable manner (e.g., via one or more transmission media, which may include "wired" and/or "wireless" transmission media) such that the computer subsystem can receive the output generated by the detectors during scanning of the specimen. Computer subsystem 36 may be configured to perform a number of functions using the output of the detectors as described herein and any other functions described further herein. This computer subsystem may be further configured as described herein.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, the different computer subsystems may be coupled to each other such that images, data, information, instructions, etc. can be sent between the computer subsystems as described further herein. For example, computer subsystem 36 may be coupled to computer subsystem(s) 102 (as shown by the dashed line in FIG. 1) by any suitable transmission media, which may include any suitable wired and/or wireless transmission media known in the art. Two or more of such computer subsystems may also be effectively coupled by a shared computer-readable storage medium (not shown).

Although the output acquisition subsystem is described above as being an optical or light-based subsystem, the output acquisition subsystem may be an electron beam-based subsystem. For example, in one embodiment, the energy directed to the specimen includes electrons, and the energy detected from the specimen includes electrons. In this manner, the energy source may be an electron beam source. In one such embodiment shown in FIG. 2, the output acquisition subsystem includes electron column 122, which is coupled to computer subsystem 124.

Figure 2:
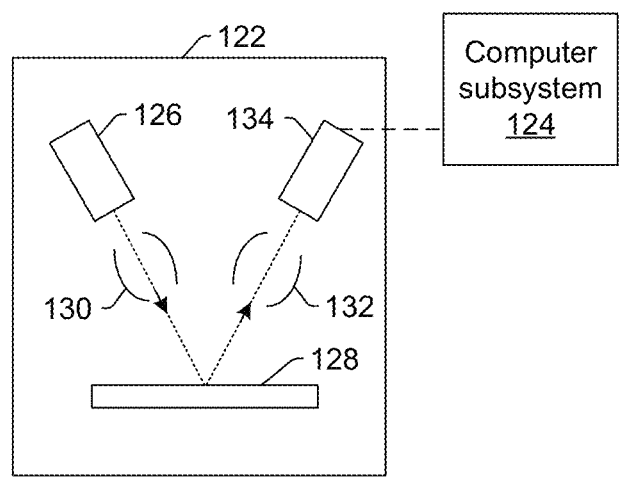

As also shown in FIG. 2, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., 8,692,204 issued Apr. 8, 2014 to Kojima et al., 8,698,093 issued Apr. 15, 2014 to Gubbens et al., and 8,716,662 issued May 6, 2014 to MacDonald et al., which are incorporated by reference as if fully set forth herein.

Although the electron column is shown in FIG. 2 as being configured such that the electrons are directed to the specimen at an oblique angle of incidence and are scattered from the specimen at another oblique angle, it is to be understood that the electron beam may be directed to and scattered from the specimen at any suitable angles. In addition, the electron beam subsystem may be configured to use multiple modes to generate images of the specimen (e.g., with different illumination angles, collection angles, etc.). The multiple modes of the electron beam subsystem may be different in any image generation parameter(s) of the subsystem.

Computer subsystem 124 may be coupled to detector 134 as described above. The detector may detect electrons returned from the surface of the specimen thereby generating output used by the computer subsystem(s) to form electron beam images of the specimen. The electron beam images may include any suitable electron beam images. Computer subsystem 124 may be configured to perform any of the functions described herein using the output of the detector and/or the electron beam images. Computer subsystem 124 may be configured to perform any additional step(s) described herein. A system that includes the output acquisition subsystem shown in FIG. 2 may be further configured as described herein.

It is noted that FIG. 2 is provided herein to generally illustrate a configuration of an electron beam-based output acquisition subsystem that may be included in the embodiments described herein. As with the optical subsystem described above, the electron beam subsystem configuration described herein may be altered to optimize the performance of the subsystem as is normally performed when designing a commercial inspection or metrology system. In addition, the systems described herein may be implemented using an existing inspection, metrology, or high resolution defect review system (e.g., by adding functionality described herein to an existing inspection, metrology, or defect review system) such as the eDR-xxxx series of tools that are commercially available from KLA. For some such systems, the embodiments described herein may be provided as optional functionality of the system (e.g., in addition to other functionality of the system). Alternatively, the system described herein may be designed "from scratch" to provide a completely new system.

Although the output acquisition subsystem is described above as being a light-based or electron beam-based subsystem, the output acquisition subsystem may be an ion beam-based subsystem. Such an output acquisition subsystem may be configured as shown in FIG. 2 except that the electron beam source may be replaced with any suitable ion beam source known in the art. In one embodiment, therefore, the energy directed to the specimen includes ions. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

The output acquisition subsystems described herein may be configured to generate output for the specimen with multiple modes. In general, a "mode" is defined by the values of parameters of the output acquisition subsystem used for generating the output used to generate images of the specimen. Therefore, modes may be different in the values for at least one of the parameters of the output acquisition subsystem (other than position on the specimen at which the output is generated). In this manner, in some embodiments, the output is generated by the output acquisition subsystem with two or more different values of a parameter of the output acquisition subsystem. For example, in an optical subsystem, different modes may use different wavelength(s) of light for illumination. The modes may be different in the illumination wavelength(s) as described further herein (e.g., by using different light sources, different spectral filters, etc.) for different modes. In another embodiment, different modes may use different illumination channels of the optical subsystem. For example, as noted above, the optical subsystem may include more than one illumination channel. As such, different illumination channels may be used for different modes. The modes may be different in any one or more alterable parameters (e.g., illumination polarization(s), angle(s), wavelength(s), etc., detection polarization(s), angle(s), wavelength(s), etc.) of the output acquisition subsystem.

In a similar manner, the output generated by the electron beam subsystem may include output generated by the electron beam subsystem with two or more different values of a parameter of the electron beam subsystem. The multiple modes of the electron beam subsystem can be defined by the values of parameters of the electron beam subsystem used for generating output for a specimen. Therefore, modes that are different may be different in the values for at least one of the electron beam parameters of the electron beam subsystem. For example, in one embodiment of an electron beam subsystem, different modes may use different angles of incidence for illumination.

The output acquisition subsystem embodiments described herein may be configured for inspection, metrology, defect review, or another quality control related process performed on the specimen. For example, the embodiments of the output acquisition subsystems described herein and shown in FIGS. 1 and 2 may be modified in one or more parameters to provide different output generation capability depending on the application for which they will be used. In one such example, the output acquisition subsystem shown in FIG. 1 may be configured to have a higher resolution if it is to be used for defect review or metrology rather than for inspection. In other words, the embodiments of the output acquisition subsystems shown in FIGS. 1 and 2 describe some general and various configurations for an output acquisition subsystem that can be tailored in a number of manners that will be obvious to one skilled in the art to produce output acquisition subsystems having different output generation capabilities that are more or less suitable for different applications.

As noted above, the optical, electron, and ion beam subsystems are configured for scanning energy (e.g., light, electrons, etc.) over a physical version of the specimen thereby generating output for the physical version of the specimen. In this manner, the optical, electron, and ion beam subsystems may be configured as "actual" subsystems, rather than "virtual" subsystems. However, a storage medium (not shown) and computer subsystem(s) 102 shown in FIG. 1 may be configured as a "virtual" system. In particular, the storage medium and the computer subsystem(s) may be configured as a "virtual" inspection system as described in commonly assigned U.S. Pat. No. 8,126,255 issued on Feb. 28, 2012 to Bhaskar et al. and 9,222,895 issued on Dec. 29, 2015 to Duffy et al., both of which are incorporated by reference as if fully set forth herein. The embodiments described herein may be further configured as described in these patents.

Generally speaking, there are two stages involved in specimen alignment to an inspection tool or other output acquisition subsystem described herein: a recipe setup stage and a runtime stage. The embodiments described herein may perform both recipe setup and runtime specimen alignment. Although having the same system or method perform both setup and runtime phases of specimen alignment may be most practical, it is not necessary. For example, one system may perform setup, and another system may perform runtime. It is also possible that one system may perform setup, and that same system as well as one or more other systems may perform runtime specimen alignment based on that setup. In another possibility, different components of the same system may be used for setup and runtime. For example, one computer subsystem may be configured to perform the setup phase, and another computer subsystem may be configured to perform the runtime phase. Other components of the system may be used for both phases. The setup phase will be described first.

The alignment described herein is the alignment of a specimen to an output acquisition subsystem (e.g., the hardware of an inspection tool, a defect review tool, a metrology tool, etc.). In general, such tools may perform some alignment of the specimen prior to or during placement of the specimen on a specimen handler coupled to the output acquisition hardware. Such alignment may include detecting an alignment mark or indicia (e.g., an edge notch or flat) on the specimen and then positioning the specimen in a particular way before or during placement on the specimen handler. However, such alignment may not be sufficiently accurate for the processes that will be performed by the output acquisition subsystems described herein. Instead, a relatively coarse alignment performed as described above may be followed by a finer alignment to achieve the desired alignment of the specimen with respect to the output acquisition subsystem.

Figure 3:
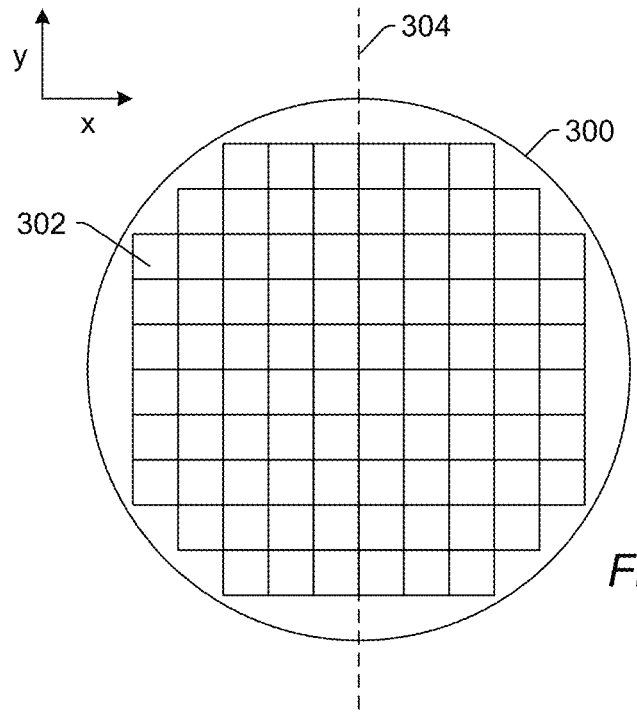
FIGS. 3 and 4 are schematic diagrams illustrating a plan view of one example of a specimen in different positions relative to an axis of an output acquisition subsystem.

FIG. 3 shows how a specimen may be oriented with respect to an axis of an output acquisition subsystem. Although the specimen is shown in FIG. 3 as wafer 300 having dice 302 formed thereon, other specimens described herein may be aligned in a similar way. When the specimen is aligned to the axis of the output acquisition subsystem, an axis of the specimen will overlap with the axis of the output acquisition subsystem and is therefore shown in FIG. 3 as single axis 304. The axis of the specimen may be a diameter of the specimen in a particular direction relative to the dice formed thereon and therefore the patterned features formed therein. The axis of the output acquisition subsystem (not shown in FIG. 3) may be defined in a number of ways such as an axis of the output acquisition subsystem hardware (e.g., a plane of incidence) or an axis of a specimen handler coupled thereto (e.g., a diameter of the specimen handler in a particular direction). Although the overlapping axes are shown in FIG. 3 extending in the y direction perpendicular to the x direction, the axes may be oriented in any suitable direction relative to the x and y directions when aligned to each other. Having the specimen arranged in a known manner with respect to the output acquisition subsystem is important for a number of reasons discussed further herein (e.g., for optimal output generation such as scanning dice and patterned features in a particular direction, for repeatability of specimen-to-specimen alignment and/or scan-to-scan alignment, etc.).

Figure 4:
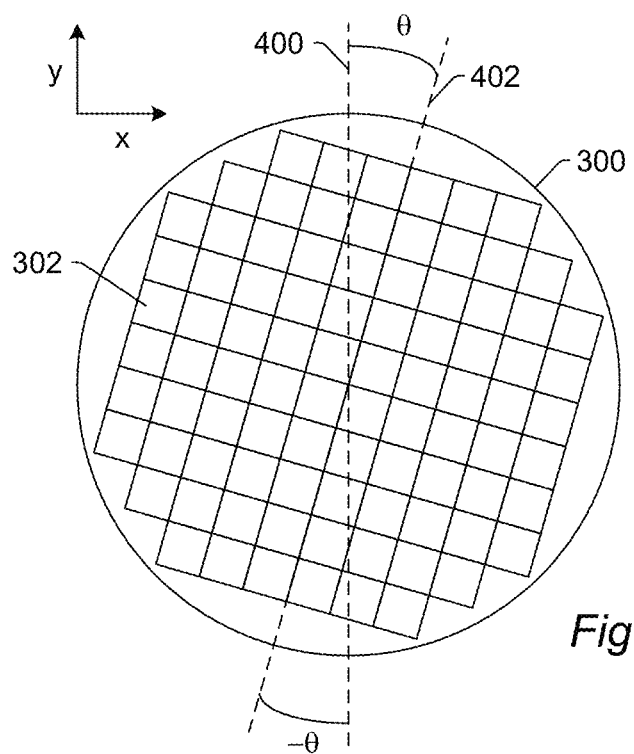

FIG. 4 shows how a specimen may be positioned with respect to an axis of an output acquisition subsystem when it is not aligned (e.g., as it may be either pre-fine alignment, before any alignment is performed, or due to errors in alignment). As shown in FIG. 4, axis 400 of the output acquisition subsystem (not shown in FIG. 4) and axis 402 of specimen 300 are not aligned due to rotation of the specimen by a particular rotational angle θ or −θ, depending on how that angle is measured. Therefore, if axes 400 and 402 are considered aligned when they overlap as shown in FIG. 3, before the specimen is scanned by the output acquisition subsystem, the orientation of the specimen relative to the output acquisition subsystem is preferably altered until those axes overlap. As such, any misalignment of the specimen to the output acquisition subsystem is preferably detected and then fixed so that the specimen can have the predetermined arrangement with respect to the output acquisition subsystem before and during the process.

The one or more computer subsystems included in the system are configured for acquiring two-dimensional (2D) images generated from the output of the detector at template locations in corresponding areas of printed instances on the specimen. As shown in step 500 of FIG. 5, which shows the setup phase of specimen alignment, the computer subsystem(s) acquire 2D images at template locations. For example, the one or more computer subsystems may include at least three components that perform the steps described herein. One of these components may include software that controls the output acquisition subsystem to scan the specimen.

Acquiring the 2D images may or may not include generating the output from which the images are generated or generating the images from the output. For example, acquiring the 2D images may include causing the output acquisition subsystem to scan energy over the specimen to thereby generate the output and then generating the 2D images from the generated output. In this manner, acquiring the 2D images may be performed using one of the output acquisition subsystems described herein. For example, the output may be generated by directing light or an electron beam to the specimen and detecting light or an electron beam from the specimen. In another example, the computer subsystem(s) may include software that controls the output acquisition subsystem hardware to scan the printed instances on the specimen thereby generating the output of the detector. In this manner, generating the output may be performed using the physical specimen itself and some sort of output acquisition hardware.

However, the embodiments described herein may acquire the output without generating it. For example, acquiring the output does not necessarily include scanning the specimen using hardware. For example, another system and/or method may generate the output and may store the generated output in one or more storage medium such as a virtual inspection system as described herein or another storage media described herein. Therefore, acquiring the output may include acquiring the output from the storage medium/media in which it has been stored.

In another embodiment, the output of the detector includes non-imaging output. The 2D images may be generated from the non-imaging output of the detector as described further above. The computer subsystem(s) may or may not acquire the 2D images by generating the images. For example, the 2D images may be generated by another system and/or method and stored in one or more storage media such as those described herein. Therefore, acquiring the 2D images may include acquiring the 2D images from the storage medium/media in which they have been stored.

As described further above, the alignment that is setup by the embodiments described herein is alignment of the specimen to the output acquisition subsystem performed during a process performed on the specimen. In some embodiments, the process performed on the specimen includes inspection, and the inspection includes detecting defects on the specimen based on output of the detector of the output acquisition subsystem generated during the inspection. In other words, unlike some other alignment methods that may use a camera or other 2D detector dedicated to alignment or a secondary process performed on the specimen such as defect review, the embodiments described herein advantageously are performed with 2D images generated from output of detector(s) that are configured and used to perform the process on the specimen. In this manner, the output from which the 2D images are generated may be output of detector(s) used for inspection and the output may have the same characteristics (e.g., resolution, etc.) as the detector output used for inspection. As such, the embodiments described herein do not use or need hardware dedicated for specimen alignment.

In one embodiment, the detector includes a photomultiplier tube (PMT). In this manner, the embodiments described herein may be configured for specimen alignment using 2D PMT images (i.e., 2D images generated from non-imaging PMT output). One advantage of the embodiments described herein is that they may use relatively large (12-bit compared to the currently used 8-bit) grey level images generated by PMTs. Another advantage of the embodiments described herein is that they can use a PMT swath image, which is much faster to generate than a 2D optical image from a review camera or other 2D detector.

The 2D images include a first image acquired at a first of the template locations and at least one additional image acquired at one or more other of the template locations. The 2D images of the template locations may be relatively small (much smaller than an image of an entire printed instance on the specimen), but otherwise may have any suitable size such as a job frame, a patch image, a frame image, an image having a pixel size of 32 pixels by 32 pixels, etc. The computer subsystem(s) therefore acquire 2D images generated at template locations in corresponding printed instances on the specimen. The printed instances may be dice, fields, and the like that are printed in an array over the specimen. In one such example, the printed instances may be dice such as dice 302 shown in FIG. 3 formed on wafer 300. In this manner, the template locations may be corresponding areas in multiple dice on a wafer, multiple fields on a wafer, etc. The template images may be acquired as described further herein.

In one embodiment, the system includes a user interface (UI), e.g., user interface 104 shown in FIG. 1, configured for displaying information to and receiving input from a user. For example, the one or more computer subsystems may include at least three components that perform the steps described herein. One of those components may be a UI that collects user settings. Although FIG. 1 shows the UI as an element separate from the computer subsystem(s), the UI may be implemented as a component included in the computer subsystem(s). The UI may be displayed on any suitable display device coupled to or included in the computer subsystem(s) as the case may be.

In some embodiments, a user may select a 2D template location in a first die using the UI, which may be configured as described further herein. The user may also set the template location in another die (or multiple other dice) on the UI. For example, the user may control the positioning of the specimen relative to the output acquisition subsystem to thereby generate images of different areas on the specimen and to use the images to select one or more potential template locations in a single printed instance or multiple printed instances. In this manner, the user may utilize the capabilities provided by the UI, output acquisition subsystem, and computer subsystem(s) to manually identify one or more 2D template locations in one or more printed instances on the specimen. The user may also select the 2D template location(s) in one or more dice without using the specimen and the output acquisition subsystem. For example, a user may view a design for the specimen with the UI and select 2D template location(s) in the design, which can be used by the computer subsystem(s) to identify the corresponding areas on the specimen and to control the output acquisition subsystem to generate output of the detector at the corresponding areas.

The template locations and other characteristics may be selected based on a number of factors, one of which may be selecting Manhattan and/or non-Manhattan patterns that are visible in the images that will be generated by the system during the process performed on the specimen. For example, if the process is inspection performed using multi-mode images (e.g., multi-channel scattered PMT images), the template preferably contains patterns that are visible in such images. The template may also preferably contain feature(s) that are unique in a localized neighborhood (e.g., within an array of pixels (e.g., a frame, job, patch image) that are processed collectively by the computer subsystem(s) during the process). Although the template locations and other characteristics may be selected by a user, the one or more computer subsystems may select such locations and characteristics automatically or semi-automatically. In general, any method or system that can be used to select alignment targets for a process such as those described herein may be used to select the template locations and other characteristics.

In one such embodiment, the input received from the user via the UI includes a 2D size of the template locations. For example, a user may set the 2D template size on the UI with a bounding box. Although any appropriate template size may be used in the embodiments described herein, some examples of template sizes that may be used include from about 25 um to about 100 um. If the template characteristics are selected automatically as described above, the 2D template size may also be selected automatically. Specifying the 2D template size is new compared to 1D projection methods, which are not performed based on any size information.

Figure 6:
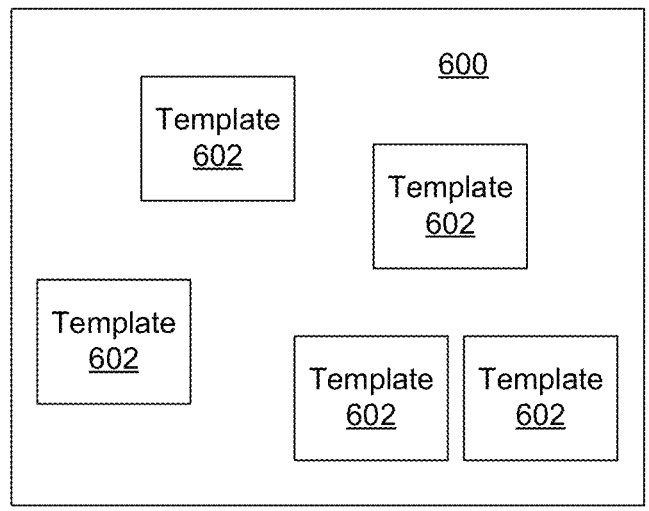
FIG. 6 is a schematic diagram illustrating a plan view of one example of locations of multiple, potential templates in a printed instance on a specimen.

The template size as well as the template itself may be selected by a user (with or without assistance from the embodiments described herein) or entirely by the embodiments described herein. There may be multiple possible template locations in each of the repeating printed instances on the specimen and one or more of them may be selected for use in the embodiments described herein. For example, as shown in FIG. 6, printed instance 600 such as a die on a wafer may include multiple possible templates 602, shown in FIG. 6 by their bounding boxes within the area of the printed instance. Obviously, the printed instance shown in FIG. 6 and each of the template locations will include patterned features such as those shown in FIGS. 8 and 9 described further herein. Each of the possible templates may include different patterned features, or some of the possible templates may include the same patterned features. A user, the computer subsystem(s) described herein, or another method or system may identify these possible templates in a number of ways such as by scanning an image of the printed instance for certain patterned features and/or patterned features having certain characteristics and then evaluating the patterned features for uniqueness relative to other patterned features in a predetermined vicinity. If more than one possible template is identified, one or more of the possible templates may be selected for use as the template(s) in the embodiments described herein in any suitable manner (e.g., by comparing the uniqueness of the different possible templates to determine which has the best uniqueness, by comparing the image quality of the different possible templates to determine which is best imaged by the output acquisition subsystem, etc.).

If more than one possible template is selected for use in the embodiments described herein, the multiple templates are preferably unique relative to each other so that they are not confused during the steps described herein. In addition, if more than one possible template is selected for use in the embodiments described herein, some or all of the steps described herein may be performed separately for different templates. For example, different offsets in the x and y directions may be determined as described herein separately and independently for different templates, and the offsets determined for each of the different templates may be used collectively to determine the angle of the specimen with respect to the output acquisition subsystem as described herein.

Figure 7:
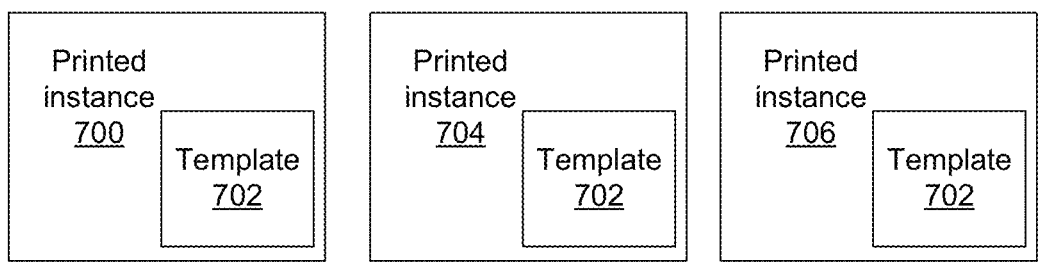
FIG. 7 is a schematic diagram illustrating a plan view of one example of template locations in corresponding areas of printed instances on a specimen.

In general, a selected template should be located in the same location within each printed instance on the specimen. For example, FIG. 7 shows three printed instances 700, 704, and 706 (although the number of printed instances formed on the specimens described herein may be substantially greater than three). In each of these three printed instances, template 702 is located at the same location within the printed instances. In other words, when each of the printed instances has the same design, the patterned features will be the same in each of the printed instances and should be formed with the same characteristics (e.g., dimensions, orientation, etc.). Therefore, once a template has been identified in one printed instance, corresponding areas in all other printed instances on the specimen can be identified as corresponding template locations.

In another such embodiment, the input includes one or more of one or more parameters used for acquiring the 2D images, a threshold used for the aligning step described further herein, a quality threshold applied to the 2D images, the predetermined value used for the comparing step described further herein, and one or more parameters used for the alignment of the specimen during the process described further herein. For example, a user may set a channel fusion mask (if the system or method performs image fusion described further herein), an alignment threshold, a template quality threshold, other wafer alignment parameters in the UI, or some combination thereof. Such parameters are believed to be new (i.e., not used in currently used specimen alignment methods and systems).

To select the channel fusion mask, the user may select from a pre-defined set of channel masks. A channel fusion mask can be generally defined as some kind of flag, indicia, or instruction to tell the computer subsystem(s) or whatever system, method, or algorithm performs the channel fusion which channel images are to be used in specimen alignment. A pre-defined default value may be provided to the user for the alignment threshold. A user may run specimen alignment using the default parameter first and then check the result and log files to adjust the threshold. A template quality threshold denotes the template uniqueness, which can be defined as the ratio of highest normalized cross correlation (NCC) peak and the second NCC peak. The other alignment parameters may include, for example, the shape parameters of the NCC peak such as slope on each side.

In some embodiments, the output acquisition subsystem is configured to direct the energy to the specimen and to detect the energy from the specimen with first and second modes, and acquiring the 2D images includes acquiring first and second mode 2D images generated with the first and second modes, respectively, at the template locations in the corresponding areas of the printed instances on the specimen, generating the first image from the first and second mode 2D images acquired at the first of the template locations, and generating the at least one additional image from the first and second mode 2D images generated at the one or more other of the template locations. In this manner, images may be generated with multiple modes at each of the template locations and then using the multiple mode images generated at each of the template locations, a fused image may be generated for each of the template locations. In one such example, if first and second modes are used to acquire the images, the first and second mode images generated at the first template location may be used to generate a fused image for the first template location, the first and second mode images generated at the second template location may be used to generate a fused image for the second template location, and so on. As such, the 2D images that are used for setting up alignment of the specimen may be fused 2D images, which may be advantageous as described further herein.

The computer subsystem(s) may send or use the template location, template size, multiple modes (e.g., three channels) of images from all of (or at least some of) the scanned printed instances (e.g., dice), and the specimen alignment parameter(s) as input to an algorithm engine, which may perform the image fusion as well as any other step(s) described herein. The computer subsystem(s) may otherwise make the template locations, template size, multiple modes or images, and the specimen alignment parameter(s) available for use in other step(s) described herein.

In one such embodiment, generating the first image and generating the at least one additional image includes image fusion. For example, an algorithm engine may fuse multimode (e.g., multi-channel) images, which is believed to be a novel feature of the embodiments described herein. The image fusion may include, for example, averaging of some or all of the images to be fused thereby creating new image data. Image fusion may also be performed as described in U.S. Pat. No. 8,223,327 issued Jul. 17, 2012 to Chen et al., which is incorporated by reference as if fully set forth herein. The embodiments described herein may be further configured as described in this patent.

In another such embodiment, the first mode 2D images include only horizontal patterns, and the second mode 2D images include only vertical patterns. For example, some modes of output acquisition subsystems described herein may be able to image only some patterns in the printed instances on the specimens described herein while other modes may be able to image only other patterns in the printed instances on the specimens. The patterns that are imaged by different modes may or may not be mutually exclusive. For example, one mode may be able to image only horizontal patterns, another mode may be able to image only vertical patterns, but a third mode may be able to image both horizontal and vertical patterns. Generally, generating images that only include some of the patterned features on a specimen and/or generating different mode images, some of which include subsets of the patterned features on the specimen, is not problematic for a process such as inspection since relatively high sensitivity defect detection can still be performed using such images. However, such images can be problematic for the alignment described herein. For example, if some images include only patterns extending in the x direction and other images include only patterns extending in the y direction, then none of the images may be used for alignment in both the x and y directions as required by the processes described herein and/or performing separate alignments for the x and y directions can reduce the accuracy of the alignment overall. Therefore, the embodiments described herein have a number of advantages over other methods and systems for alignment in that the embodiments described herein can use images for alignment even if they do not individually include all of the patterns formed on the specimen.

The computer subsystem(s) are also configured for determining offsets in x and y directions between the template locations, and determining the offsets includes aligning the first image to the at least one additional image. As shown in step 502 of FIG. 5, the computer subsystem(s) determine offsets in x and y directions between the template locations. For example, the one or more computer subsystems may include at least three components that perform the steps described herein. One of these components may be an algorithm that calculates specimen alignment using the PMT images and user settings. The offsets may be determined between the first image generated at the first template location and any other images generated at the other template locations. In this manner, the offset between any one template location may be determined with respect to the first template location. The offsets may be calculated from the output of the aligning step.

Figure 8:
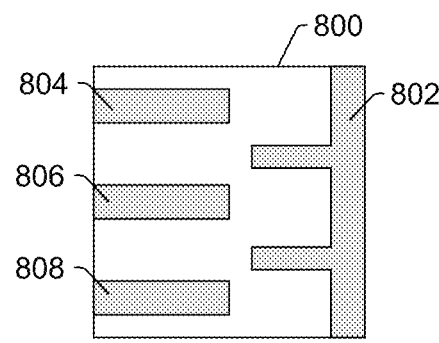
FIG. 8 is a schematic diagram illustrating a plan view of one example of a two-dimensional (2D) image generated from output of a detector of an output acquisition subsystem at a template location in a printed instance on a specimen.
Figure 9:
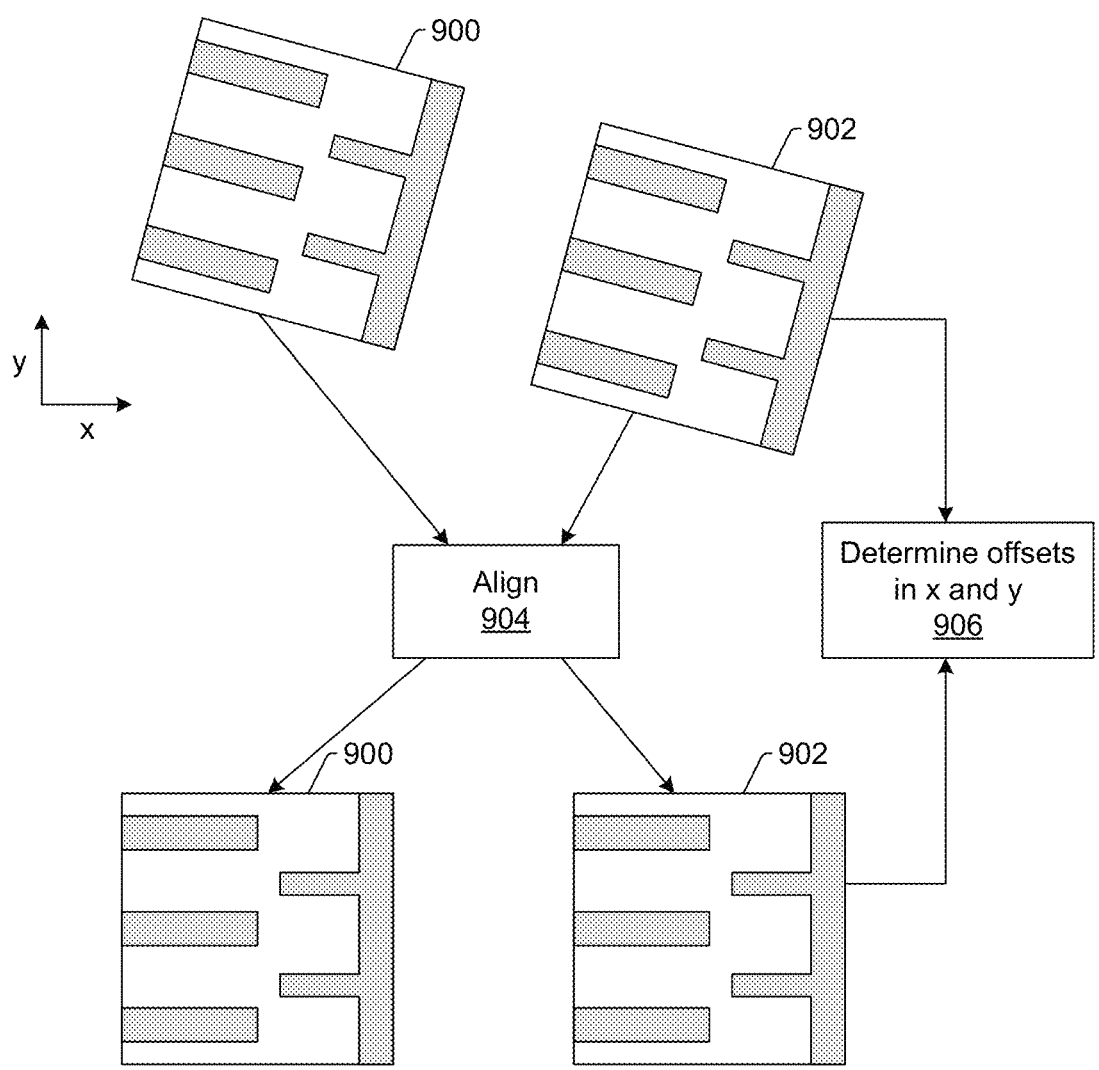
FIG. 9 is a schematic diagram illustrating a plan view of one example of 2D images generated from output of a detector of an output acquisition subsystem at template locations in corresponding areas of printed instances on a specimen and one embodiment of how the 2D images can be used for determining offsets in x and y directions between the template locations.

FIGS. 8 and 9 illustrate how the offsets may be determined. For example, FIG. 8 shows an example of what a 2D template image might look like. In this example, 2D template image 800 includes a number of patterned features 802, 804, 806, and 808. In this example, the patterned features shown in the image may not necessarily be the most unique with respect to their shape, but the patterned features may have some unique spatial relationship that renders them collectively unique and therefore suitable for use as a template. In FIGS. 8 and 9, the example images are not meant to be illustrative of any particular images or specimens described herein. For example, patterned features such as those shown in FIGS. 8 and 9 may not be formed with perfectly square corners, perfectly straight lines, perfectly smooth edges, etc. as shown in FIGS. 8 and 9 and the images may reflect those imperfections as well as other potential image artifacts that may vary somewhat from template location to template location. In addition, the patterned features will vary depending on the design for the specimen and therefore may be different from those shown in FIGS. 8 and 9.

Figure 5:
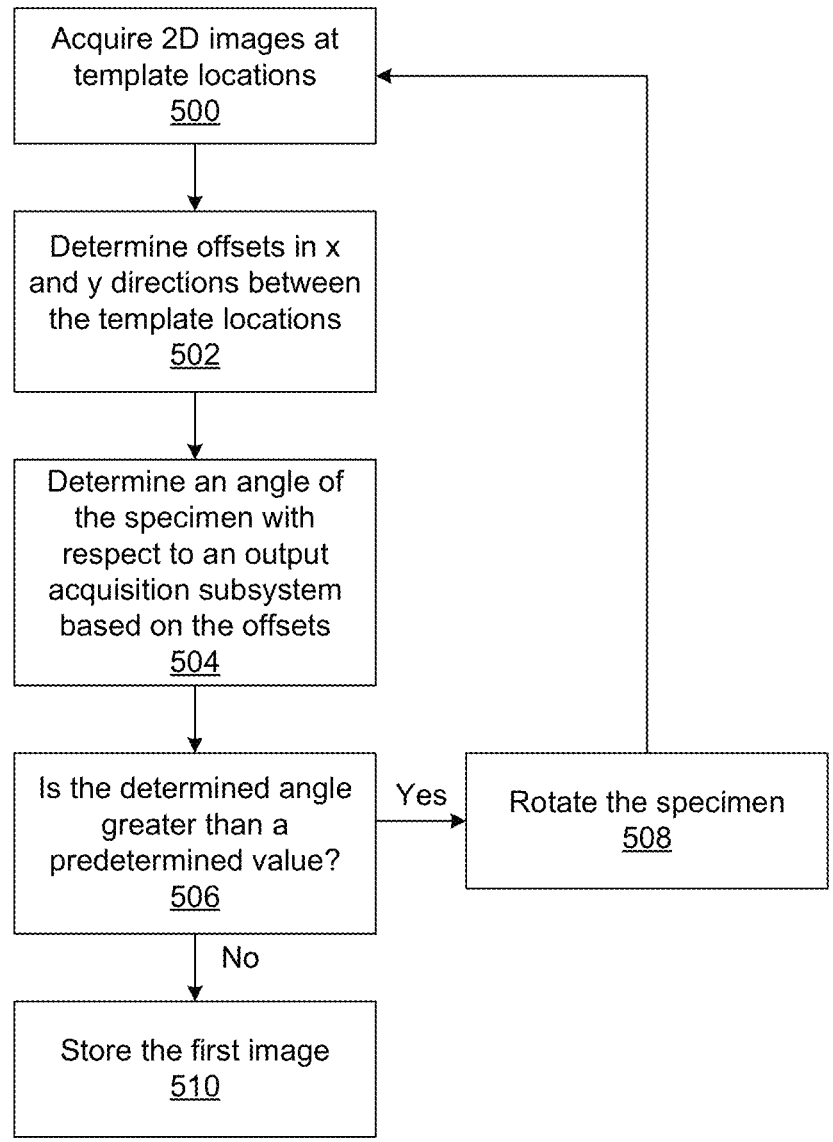
FIG. 5 is a flow chart illustrating one embodiment of steps that may be performed for setting up alignment of a specimen.

As shown in FIG. 9, first image 900 acquired at a first template location and additional image 902 acquired at one other of the template locations may be aligned to each other in align step 904, which may be performed as part of step 502 shown in FIG. 5. As shown in FIG. 9, additional image 902 may have some y offset (as shown) and x offset (not shown) compared to first image 900 which may be the case when the specimen is not properly aligned with respect to the output acquisition subsystem. The offsets shown in FIG. 9 between images 900 and 902 prior to alignment are not however meant to illustrate any particular offset that may occur between the 2D template images acquired and used by the embodiments described herein. Instead, FIG. 9 is simply included to further understanding of the embodiments described herein. In order to align the two images, then, the one or more computer subsystems may alter the position of one of the images with respect to the other until they are aligned. After the images have been aligned as shown by the output of the align step, the original position of image 902 prior to alignment may be compared to the resulting position of image 902 after alignment and the differences between these positions may be used to determine the offsets in x and y as shown in step 906 shown in FIG. 9. Therefore, based on the output of the alignment step, the offsets can be determined in x and y and then used in other steps described herein.

Again, what is shown in FIGS. 8 and 9 is merely included herein to schematically illustrate and further understanding of the invention. Instead of a trial and error process such as that described above, where the position of one image is altered until it aligns with another image, any suitable alignment method or algorithm such as NCC can be used by the embodiments described herein. In this manner, the offsets can be determined from the output of the alignment algorithm or method.

In some embodiments, the offsets in the x and y directions are sub-pixel offsets in the x and y directions. In other words, the offsets in the x and y directions may be determined with sub-pixel accuracy. "Sub-pixel" as that term is used herein is generally defined as smaller than a pixel of output generated by an output acquisition subsystem. In this manner, "sub-pixel accuracy" as that term is used herein can be generally defined as the determination of something (e.g. x and y offsets) with an error smaller than the size (distance from one side to the other) of a single pixel in the output generated by the output acquisition subsystem or the images generated therefrom.

In one such embodiment, the one or more computer subsystems may calculate sub-pixel x and y offsets between the template and all (or at least some) dice using an alignment method such as NCC. Although NCC may be one particularly useful method for alignment in the embodiments described herein, any other suitable alignment method may be used such as a sum of square difference (SSD) or a brute force method. Using such an offset calculation method for specimen alignment is new compared to the one-dimensional (1D) projection method for specimen alignment described further above. In another embodiment, the aligning does not include projecting patterned features in the first image and the at least one additional image in the x or y direction. For example, the alignment described herein does not include projection based methods such as those described further herein. Performing alignment as described herein without projecting patterned features in the x and/or y directions is advantageous as described further herein.

In some embodiments, the system is configured for specimen alignment using multi-channel or multi-mode 2D images such as PMT images. For example, in one embodiment, the output acquisition subsystem is configured to direct the energy to the specimen and to detect the energy from the specimen with first and second modes, the first image and the at least one additional image are acquired with the first mode, the one or more computer subsystems are configured for acquiring additional 2D images generated with the second mode at the template locations in the corresponding areas of the printed instances on the specimen, the additional 2D images include a second image acquired at the first of the template locations with the second mode and at least one other image acquired at the one or more other of the template locations with the second mode, and determining the offsets includes determining a first of the offsets in the x and y directions by aligning the first image to the at least one additional image and determining a second of the offsets in the x and y directions by aligning the second image to the at least one other image. In this manner, images may be generated for different template locations with different modes, which may be performed as described further herein. The images generated for the template locations with one mode may be used for determining one of the offsets and the images generated for the template locations with another mode may be used for determining another of the offsets. Determining different offsets from separate sets of images may otherwise be performed as described herein. The offsets determined separately may be collectively used to determine an angle of the specimen as described further herein.

In one such embodiment, the first image and the at least one additional image include only horizontal patterns, and the second image and the at least one other image include only vertical patterns. Such images may be generated for reasons described further herein (i.e., the ability of different modes to generate images of different patterns). In other words, in the same area on a specimen in which images are generated with different modes, only some of the patterned features in that area may be in images generated with one of the modes and only others of the patterned features in that area may be in images generated with another mode. Rather than fuse the images as described above so that all of the patterned features are included in the images fused from the multi-mode images, the multi-mode images may be used separately to determine different offsets.

The offsets described herein may be determined and output by the computer subsystem(s) in any suitable format (e.g., simple values, a relationship or function, etc.), in any suitable units (e.g., dimensions, pixels, coordinates, etc.), in any suitable coordinates (e.g., Cartesian or polar). The offsets that are determined by the computer subsystem(s) may also be converted from one format to another, one unit to another, one coordinate system to another in any suitable manner known in the art if so desired.

The computer subsystem(s) are further configured for determining an angle of the specimen with respect to the output acquisition subsystem based on the offsets in the x and y directions. As shown in step 504 of FIG. 5, the computer subsystem(s) determine an angle of the specimen with respect to an output acquisition subsystem based on the offsets determined in step 502. In this manner, the one or more computer subsystems use the offsets to calculate specimen angle. Determining the angle of the specimen based on the offsets may be performed in any suitable manner known in the art. In one such example, determining the angle of the specimen with respect to the output acquisition subsystem can be performed using any suitable function that can be used to translate the determined x and y offsets to an angle between specimen and subsystem hardware based on known geometrical relationships of subsystem hardware relative to the template locations as well as the template locations relative to one another. As such, a suitable function may vary depending on the output acquisition subsystem configuration as well as how it reports output generation locations.

The computer subsystem(s) are also configured for comparing the determined angle to a predetermined value. As shown in step 506 of FIG. 5, for example, the computer subsystem(s) determine if the determined angle is greater than a predetermined value. In this manner, the one or more computer subsystems check whether the specimen angle is smaller than a predefined value. The predefined value may be a default value specific to a system or process or may be input by a user using a UI as described herein. However the predetermined value is defined, it may be responsive to the specimen-to-hardware alignment accuracy required or desired for the process. For example, for processes in which better alignment is required, the predetermined value may be closer to zero (which would be the case for perfect alignment) than for processes in which the alignment requirements are more relaxed. Therefore, the predetermined value describes the desired or required alignment, and comparing the angle to the predetermined value is performed to determine if the specimen is aligned to the output acquisition subsystem with sufficient accuracy.

When the determined angle is greater than the predetermined value, the computer subsystem(s) are configured for rotating the specimen and repeating the acquiring, determining the offsets, determining the angle, and comparing steps. For example, if the specimen angle is not smaller than a predefined value, the one or more computer subsystems may rotate the specimen based on the calculated angle and then repeat the steps described above beginning with the specimen scanning step. As shown in FIG. 5, for example, when the determined angle is determined to be greater than the predetermined value in step 506, the computer subsystem(s) may rotate the specimen as shown in step 508. After the specimen has been rotated, the computer subsystem(s) may repeat steps 500, 502, 504, and 506.

In this manner, when the determined angle is greater than the predetermined value, that means that the specimen is not sufficiently aligned to the output acquisition subsystem. Based on the differences between the determined angle and the predetermined value, the computer subsystem(s) may determine how much and in which direction to rotate the specimen. For example, the computer subsystem(s) may cause the specimen to be rotated (e.g., by controlling the specimen handler to rotate the specimen) in an amount equal and direction opposite to the difference between the determined angle and the predetermined value. As such, the steps described above may be repeated in an iterative manner until the determined angle is not greater than the predetermined value.

In some embodiments, a number of the at least one additional image acquired and used for determining the offsets is less than a number of the at least one additional image acquired in repeating the acquiring and used for repeating determining the offsets. For example, the computer subsystem(s) or software included in or used by the computer subsystem(s) may control the output acquisition subsystem hardware to scan two dice in the first iteration and more dice in subsequent iterations. In particular, on the first iteration, the specimen angle may be relative large. As a result, the template location may not be fully included in more than two dice in the scanned swath image thereby rendering any additional images from other dice useless for the purposes described herein. In subsequent iterations, the specimen has been rotated, which should mean that the specimen is better aligned to the output acquisition subsystem. Therefore, more dice on the specimen can be used to perform better alignment.

When the determined angle is less than the predetermined value, the computer subsystem(s) are configured for storing the first image for use in alignment of the specimen to the output acquisition subsystem during a process performed on the specimen. In this manner, when the specimen angle is determined to be smaller than a predefined value, the one or more computer subsystems may store the first template image in a recipe and mark the recipe setup as done. As shown in FIG. 5, for example, when the determined angle is determined to be less than a predetermined value in step 506, the computer subsystem(s) store the first image in step 510.

The computer subsystem(s) may store the first image in any suitable computer-readable storage medium. The first image may be stored with any of the results described herein and may be stored in any manner known in the art. The storage medium may include any storage medium described herein or any other suitable storage medium known in the art. After the first image has been stored, the first image can be accessed in the storage medium and used by any of the method or system embodiments described herein, formatted for display to a user, used by another software module, method, or system, etc.

In one embodiment, storing the first image includes storing the first image for use in the process performed on the specimen and the process performed on at least one other specimen of the same type as the specimen. For example, the embodiments described herein may set up alignment of a specimen for a process recipe, which may be performed as part of setting up, creating, calibrating, or updating the recipe. That recipe may then be stored and used by the embodiments described herein (and/or another system or method) to perform the process on the specimen and/or other specimens to thereby generate information (e.g., defect information) for the specimen and/or other specimens. In this manner, the first image may be generated and stored once per specimen layer, and the first image may be used for the process performed on multiple specimens of the same layer. Of course, as in any process, if the process performed on the specimen layer is updated, calibrated, modified, re-trained, etc., the first image may also be updated, calibrated, modified, retrained, etc. in the same manner as any other process parameter. Updating, calibrating, modifying, retraining, etc. the first image may be performed in the same manner described herein for setting up the alignment of the specimen. In this manner, the embodiments described herein may be configured for repeating the steps described herein at various times to modify a previously setup process.

Figure 10:
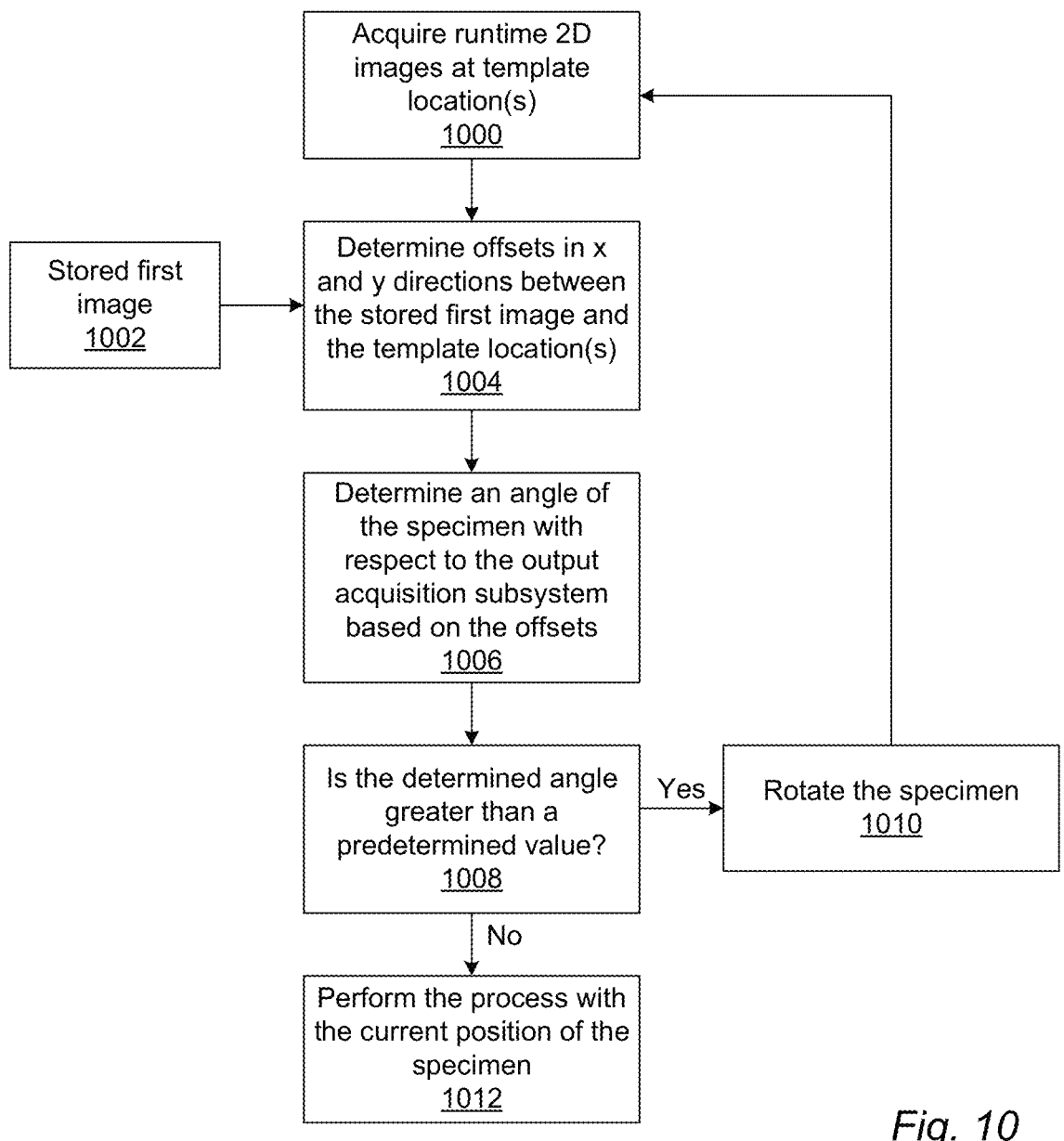
FIG. 10 is a flow chart illustrating one embodiment of steps that may be performed for aligning a specimen during a process performed on the specimen.

The run-time stage will now be described and is shown in FIG. 10. In one embodiment, the output acquisition subsystem and the one or more computer subsystems are configured for performing the process on the specimen by acquiring at least one runtime 2D image generated from the output of the detector at one or more of the template locations in the corresponding areas of the printed instances on the specimen, determining the offsets in the x and y directions between the stored first image and the one or more of the template locations by aligning the stored first image to the at least one runtime 2D image, and performing the determining the angle, comparing, rotating, and repeating steps until the determined angle is less than the predetermined value. For example, at runtime, the template data has already been saved in recipe. So there are no user setup steps such as those described above. Instead, the one or more computer subsystems and/or the UI extracts template data from the recipe. In this manner, the steps of the method described above beginning with the scanning of the specimen may be repeated until the specimen angle is smaller than the predefined value. The runtime stage steps are described further below.

As shown in step 1000, the computer subsystem(s) may acquire runtime 2D images at template location(s). This step may be performed as described further herein except that the image acquisition may be performed in a different manner during setup than runtime. In one such example, the setup and runtime 2D image acquisitions may involve different specimen scanning paths and/or generating different numbers of 2D images at different numbers of template locations. At runtime, the UI may extract template data and specimen alignment parameters from recipe. This step may be unlike that described above in which a user may provide such data and parameters using the UI. The computer subsystem(s) or associated software may control the output acquisition subsystem to scan one die row (e.g., one swath image centering the marked site and not necessarily only one die row). This step may be unlike that performed in setup when only one or a few dice may be scanned.

As shown in FIG. 10, stored first image 1002 and the runtime 2D images acquired in step 1000 may be input to step 1004 in which the one or more computer subsystems determine offsets in x and y directions between the stored first image and the template location(s). Determining the offsets in the x and y directions may be performed in the same manner during runtime as described above with respect to setup, except that the input images are different. For example, the one or more computer subsystems may send the template data, one or more channels (or modes) of images from all scanned dice and the specimen alignment parameters to an algorithm engine. The algorithm engine may fuse channel (or mode) images and then calculates sub-pixel x and y offsets between the template and all scanned dice using, for example, NCC.

The determined offsets may then be used to perform step 1006 in which the one or more computer subsystems determine an angle of the specimen with respect to the output acquisition subsystem based on the offsets. Determining the angle of the specimen with respect to the output acquisition subsystem may also be performed as described above with respect to setup. In this manner, the one or more computer subsystems may use the offsets to calculate specimen angle.

The one or more computer subsystems may then determine if the determined angle is greater than a predetermined value in step 1008. The predetermined value may be the same as that used for setup. If the determined angle is greater than the predetermined value, the one or more computer subsystems rotate the specimen as shown in step 1010 and then repeat the steps described above starting with step 1000. If the determined angle is less than the predetermined value, the output acquisition subsystem and the computer subsystem(s) perform the process with the current position of the specimen as shown in step 1012. In this manner, the one or more computer subsystems may check whether the specimen angle is smaller than a predefined value. If the angle is smaller than the predefined value, the one or more computer subsystems may mark the specimen as aligned, which is different than the setup phase, and may mark the runtime specimen alignment as done, which is also different than the setup phase. If the specimen angle is not smaller than the predefined value, the one or more computer subsystems may rotate the specimen based on the calculated angle and repeat the steps starting at the scanning of one die row on the specimen.

The embodiments described herein may also perform the process after the specimen has been aligned in runtime as described above. The process may include any of those described herein such as inspection, defect review, metrology, and the like. The computer subsystem(s) may be configured for storing information for the specimen generated by the performing the process such as information for detected defects in any suitable computer-readable storage medium. The information may be stored with any of the results described herein and may be stored in any manner known in the art. The storage medium may include any storage medium described herein or any other suitable storage medium known in the art. After the information has been stored, the information can be accessed in the storage medium and used by any of the method or system embodiments described herein, formatted for display to a user, used by another software module, method, or system, etc.

Results and information generated by performing the processes described herein on the specimen or other specimens of the same type may be used in a variety of manners by the embodiments described herein and/or other systems and methods. Such functions include, but are not limited to, altering a process such as a fabrication process or step that was or will be performed on the specimen or another specimen in a feedback or feedforward manner. For example, the computer subsystem(s) may be configured to determine one or more changes to a process that was or will be performed on a specimen inspected as described herein based on the detected defect(s). The changes to the process may include any suitable changes to one or more parameters of the process. The computer subsystem(s) preferably determine those changes such that the defects can be reduced or prevented on other specimens on which the revised process is performed, the defects can be corrected or eliminated on the specimen in another process performed on the specimen, the defects can be compensated for in another process performed on the specimen, etc. The computer subsystem(s) may determine such changes in any suitable manner known in the art.

Those changes can then be sent to a semiconductor fabrication system (not shown) or a storage medium (not shown) accessible to the computer subsystem(s) and the semiconductor fabrication system. The semiconductor fabrication system may or may not be part of the system embodiments described herein. For example, the computer subsystem(s) and/or output acquisition subsystem described herein may be coupled to the semiconductor fabrication system, e.g., via one or more common elements such as a housing, a power supply, a specimen handling device or mechanism, etc. The semiconductor fabrication system may include any semiconductor fabrication system known in the art such as a lithography tool, an etch tool, a chemical-mechanical polishing (CMP) tool, a deposition tool, and the like.

As described herein, therefore, the embodiments can be used to setup a new process or recipe. The embodiments may also be used to modify an existing process or recipe, whether that is a process or recipe that was used for the specimen or was created for one specimen and is being adapted for another specimen. In addition, the embodiments described herein are not limited to inspection process creation or modification. For example, the embodiments described herein can also be used to setup or modify a process for metrology, defect review, etc. in a similar manner. In particular, setting up alignment and performing specimen alignment as described herein can be performed regardless of the process that is being setup or revised. The embodiments described herein can therefore be used not just for setting up or modifying an inspection process but can be used for setting up or modifying any quality control type process performed on the specimens described herein.

The embodiments described herein provide a number of advantages over previously used methods and systems for setting up alignment of a specimen and aligning a specimen during a process performed on the specimen. For example, the embodiments described herein improve alignment success rate by using 2D images. In particular, 2D images are less likely to align to the wrong patterns, which is the major failure reason of the 1D projection methods. In addition, the embodiments described herein can improve alignment success rates by using multiple channel images. Multi-channel fusion can obtain both horizontal and vertical patterns in images. Alignment performance is improved when both patterns exist. Good specimen alignment is crucial to subsequent specimen inspection. Current inspection tools may suffer higher than expected alignment failures using the existing 1D projection and 2D optical method. The embodiments described herein will improve the overall specimen alignment performance.

The advantages of the embodiments described herein are therefore a direct result of certain novel features of the embodiments. Such novel features include, but are not limited to, that the embodiments can use 2D PMT images for specimen alignment (compared to 1D projections). The novel features also include, but are not limited to, that the embodiments may fuse multi-mode (e.g., multi-channel) images in specimen alignment (compared to single channel in 1D projection and 2D optical methods).

Each of the embodiments of each of the systems described above may be combined together into one single embodiment.

Another embodiment relates to a computer-implemented method for setting up alignment of a specimen. The method includes the acquiring, determining offsets, determining an angle, comparing, rotating, repeating, and storing steps described above.

Each of the steps of the method may be performed as described further herein. The method may also include any other step(s) that can be performed by the output acquisition subsystem and/or computer subsystem(s) or system(s) described herein. The acquiring, determining offsets, determining an angle, comparing, rotating, repeating, and storing steps are performed by one or more computer subsystems, which may be configured according to any of the embodiments described herein. In addition, the method described above may be performed by any of the system embodiments described herein.

Figure 11:
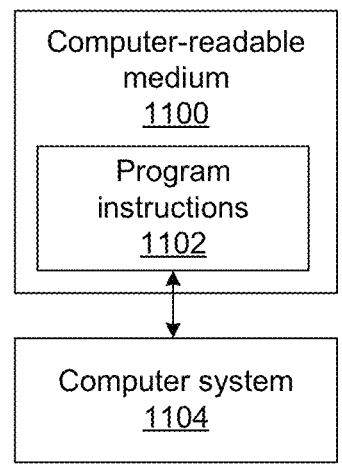
FIG. 11 is a block diagram illustrating one embodiment of a non-transitory computer-readable medium storing program instructions for causing a computer system to perform a computer-implemented method described herein.

An additional embodiment relates to a non-transitory computer-readable medium storing program instructions executable on a computer system for performing a computer-implemented method for setting up alignment of a specimen. One such embodiment is shown in FIG. 11. In particular, as shown in FIG. 11, non-transitory computer-readable medium 1100 includes program instructions 1102 executable on computer system 1104. The computer-implemented method may include any step(s) of any method(s) described herein.

Program instructions 1102 implementing methods such as those described herein may be stored on computer-readable medium 1100. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 1104 may be configured according to any of the embodiments described herein.

Further modifications and alternative embodiments of various aspects of the invention will be apparent to those skilled in the art in view of this description. For example, methods and systems for setting up alignment of a specimen are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured for setting up alignment of a specimen, comprising:

an output acquisition subsystem comprising at least an energy source and a detector, wherein the energy source is configured to generate energy that is directed to the specimen, wherein the detector is configured to detect energy from the specimen and to generate output responsive to the detected energy, and wherein the output acquisition subsystem is configured to direct the energy to the specimen and to detect the energy from the specimen with first and second modes; and one or more computer subsystems configured for:

acquiring two-dimensional images generated from the output of the detector at template locations in corresponding areas of printed instances on the specimen, wherein the two-dimensional images comprise a first image acquired at a first of the template locations and at least one additional image acquired at one or more other of the template locations, and wherein said acquiring comprises acquiring first and second mode two-dimensional images generated with the first and second modes, respectively, at the template locations in the corresponding areas of the printed instances on the specimen, generating the first image from the first and second mode two-dimensional images acquired at the first of the template locations, and generating the at least one additional image from the first and second mode two-dimensional images generated at the one or more other of the template locations;

determining offsets in x and y directions between the template locations, wherein determining the offsets comprises aligning the first image to the at least one additional image;

determining an angle of the specimen with respect to the output acquisition subsystem based on the offsets in the x and y directions;

comparing the determined angle to a predetermined value;

when the determined angle is greater than the predetermined value, rotating the specimen and repeating the acquiring, determining the offsets, determining the angle, and comparing steps; and when the determined angle is less than the predetermined value, storing the first image for use in alignment of the specimen to the output acquisition subsystem during a process performed on the specimen.

2. The system of claim 1, wherein the detector comprises a photomultiplier tube.

3. The system of claim 1, wherein the output of the detector comprises non-imaging output.

4. The system of claim 1, wherein the one or more computer subsystems are further configured for acquiring additional two-dimensional images generated with the second mode at the template locations in the corresponding areas of the printed instances on the specimen, wherein the additional two-dimensional images comprise a second image acquired at the first of the template locations with the second mode and at least one other image acquired at the one or more other of the template locations with the second mode, and wherein determining the offsets further comprises determining a first of the offsets in the x and y directions by aligning the first image to the at least one additional image and determining a second of the offsets in the x and y directions by aligning the second image to the at least one other image.

5. The system of claim 4, wherein the first image and the at least one additional image comprise only horizontal patterns, and wherein the second image and the at least one other image comprise only vertical patterns.

6. The system of claim 1, wherein generating the first image and generating the at least one additional image comprises image fusion.

7. The system of claim 1, wherein the first mode two-dimensional images comprise only horizontal patterns, and wherein the second mode two-dimensional images comprise only vertical patterns.

8. The system of claim 1, wherein the offsets in the x and y directions are sub-pixel offsets in the x and y directions.

9. The system of claim 1, wherein said aligning does not comprise projecting patterned features in the first image and the at least one additional image in the x or y direction.

10. The system of claim 1, wherein a number of the at least one additional image acquired and used for determining the offsets is less than a number of the at least one additional image acquired in repeating the acquiring and used for repeating determining the offsets.

11. The system of claim 1, wherein the output acquisition subsystem and the one or more computer subsystems are further configured for performing the process on the specimen by acquiring at least one runtime two-dimensional image generated from the output of the detector at one or more of the template locations in the corresponding areas of the printed instances on the specimen, determining the offsets in the x and y directions between the stored first image and the one or more of the template locations by aligning the stored first image to the at least one runtime two-dimensional image, and performing the determining the angle, comparing, rotating, and repeating until the determined angle is less than the predetermined value.

12. The system of claim 1, further comprising a user interface configured for displaying information to and receiving input from a user, wherein the input comprises a two-dimensional size of the template locations.

13. The system of claim 1, further comprising a user interface configured for displaying information to and receiving input from a user, wherein the input comprises one or more of one or more parameters used for acquiring the two-dimensional images, a threshold used for said aligning, a quality threshold applied to the two-dimensional images, the predetermined value used for the comparing step, and one or more parameters used for the alignment of the specimen performed during the process.

14. The system of claim 1, wherein the process performed on the specimen comprises inspection, and wherein the inspection comprises detecting defects on the specimen based on output of the detector of the output acquisition subsystem generated during the inspection.

15. The system of claim 1, wherein the specimen comprises a wafer.

16. The system of claim 1, wherein the energy directed to the specimen comprises light, and wherein the energy detected from the specimen comprises light.

17. The system of claim 1, wherein the energy directed to the specimen comprises electrons, and wherein the energy detected from the specimen comprises electrons.

18. A non-transitory computer-readable medium, storing program instructions executable on a computer system for performing a computer-implemented method for setting up alignment of a specimen, wherein the computer-implemented method comprises:

acquiring two-dimensional images generated from output of a detector of an output acquisition subsystem at template locations in corresponding areas of printed instances on the specimen, wherein the two-dimensional images comprise a first image acquired at a first of the template locations and at least one additional image acquired at one or more other of the template locations;

wherein the output acquisition subsystem comprises at least an energy source and the detector, wherein the energy source is configured to generate energy that is directed to the specimen, wherein the detector is configured to detect energy from the specimen and to generate the output responsive to the detected energy, and wherein the output acquisition subsystem is configured to direct the energy to the specimen and to detect the energy from the specimen with first and second modes; and wherein said acquiring comprises acquiring first and second mode two-dimensional images generated with the first and second modes, respectively, at the template locations in the corresponding areas of the printed instances on the specimen, generating the first image from the first and second mode two-dimensional images acquired at the first of the template locations, and generating the at least one additional image from the first and second mode two-dimensional images generated at the one or more other of the template locations;

determining offsets in x and y directions between the template locations, wherein determining the offsets comprises aligning the first image to the at least one additional image;

determining an angle of the specimen with respect to the output acquisition subsystem based on the offsets in the x and y directions;

comparing the determined angle to a predetermined value;

when the determined angle is greater than the predetermined value, rotating the specimen and repeating the acquiring, determining the offsets, determining the angle, and comparing steps; and when the determined angle is less than the predetermined value, storing the first image for use in alignment of the specimen to the output acquisition subsystem during a process performed on the specimen, wherein the acquiring, determining the offsets, determining the angle, comparing, rotating, repeating, and storing steps are performed by the computer system.

19. A computer-implemented method for setting up alignment of a specimen, comprising:

acquiring two-dimensional images generated from output of a detector of an output acquisition subsystem at template locations in corresponding areas of printed instances on the specimen, wherein the two-dimensional images comprise a first image acquired at a first of the template locations and at least one additional image acquired at one or more other of the template locations;

wherein the output acquisition subsystem comprises at least an energy source and the detector, wherein the energy source is configured to generate energy that is directed to the specimen, wherein the detector is configured to detect energy from the specimen and to generate the output responsive to the detected energy, and wherein the output acquisition subsystem is configured to direct the energy to the specimen and to detect the energy from the specimen with first and second modes; and wherein said acquiring comprises acquiring first and second mode two-dimensional images generated with the first and second modes, respectively, at the template locations in the corresponding areas of the printed instances on the specimen, generating the first image from the first and second mode two-dimensional images acquired at the first of the template locations, and generating the at least one additional image from the first and second mode two-dimensional images generated at the one or more other of the template locations;

determining offsets in x and y directions between the template locations, wherein determining the offsets comprises aligning the first image to the at least one additional image;

determining an angle of the specimen with respect to the output acquisition subsystem based on the offsets in the x and y directions;

comparing the determined angle to a predetermined value;

when the determined angle is greater than the predetermined value, rotating the specimen and repeating the acquiring, determining the offsets, determining the angle, and comparing steps; and when the determined angle is less than the predetermined value, storing the first image for use in alignment of the specimen to the output acquisition subsystem during a process performed on the specimen, wherein the acquiring, determining the offsets, determining the angle, comparing, rotating, repeating, and storing steps are performed by one or more computer subsystems.

* * * * *